United States Patent
Abe et al.

(10) Patent No.: US 7,450,392 B2
(45) Date of Patent: Nov. 11, 2008

(54) CABLE MODEM DEVICE AND METHOD OF ASSEMBLING THE SAME

(75) Inventors: Shuji Abe, Kumagaya (JP); Katsuya Kudo, Fukaya (JP); Tsutomu Isoda, Takasaki (JP); Masami Oosawa, Kumagaya (JP); Mikine Fujihara, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/594,883

(22) Filed: Nov. 9, 2006

(65) Prior Publication Data

US 2007/0056007 A1 Mar. 8, 2007

Related U.S. Application Data

(62) Division of application No. 10/826,910, filed on Apr. 19, 2004, now Pat. No. 7,207,106.

(30) Foreign Application Priority Data

Jun. 6, 2003 (JP) ............................. 2003-162021

(51) Int. Cl.
*H05K 5/00* (2006.01)

(52) U.S. Cl. ...................... 361/752; 361/760; 361/784; 361/794

(58) Field of Classification Search ................. 361/736, 361/816, 752, 760, 784, 794; 29/837
See application file for complete search history.

(56) References Cited

U.S. PATENT DOCUMENTS

| | | | |
|---|---|---|---|
| 4,677,037 A | 6/1987 | Takabayashi | |
| 4,962,462 A | 10/1990 | Fekete | |
| 4,968,566 A | 11/1990 | Lersch et al. | |
| 5,130,600 A | 7/1992 | Tomita et al. | |
| 5,557,507 A * | 9/1996 | Koike et al. | 361/816 |
| 5,780,980 A | 7/1998 | Naito | |
| 5,916,699 A | 6/1999 | Thomas et al. | |
| 5,964,309 A | 10/1999 | Kimura et al. | |
| 5,970,055 A | 10/1999 | Park et al. | |

(Continued)

FOREIGN PATENT DOCUMENTS

EP 1 091 437 A1 4/2001

(Continued)

OTHER PUBLICATIONS

Jaesung Han et al., "Direct methanol fuel-cell combined with a small back-up battery," Journal of Power Sources 112, Elsevier Science B.V., p. 477-483, (Aug. 3, 2002).

*Primary Examiner*—Dean A. Reichard
*Assistant Examiner*—Andargie M Aychillhum
(74) *Attorney, Agent, or Firm*—Pillsbury Winthrop Shaw Pittman, LLP

(57) ABSTRACT

There is disclosed a cable modem device capable of reducing unnecessary signals inputted into a circuit substrate which processes signals and signal terminals from the outside and unnecessary radiation generated by the circuit substrate, the device having a hexahedral shield case which shields a circuit substrate, and a plurality of terminals for use in input/output of the signals with respect to the circuit substrate. Each of the terminals has a noise filter function, and is fixed to the shield case.

9 Claims, 6 Drawing Sheets

U.S. PATENT DOCUMENTS

| | | | |
|---|---|---|---|
| 6,079,099 A * | 6/2000 | Uchida et al. | 29/837 |
| 6,118,672 A | 9/2000 | Yamauchi et al. | |
| 6,285,559 B1 * | 9/2001 | Fukiharu | 361/760 |
| 6,301,117 B1 | 10/2001 | Yamauchi et al. | |
| 6,326,097 B1 | 12/2001 | Hockaday | |
| 6,358,062 B1 | 3/2002 | Feldman et al. | |
| 6,373,711 B2 * | 4/2002 | Yamauchi et al. | 361/752 |
| 6,404,309 B1 * | 6/2002 | Hall et al. | 334/85 |
| 6,700,061 B2 * | 3/2004 | Kishimoto | 174/377 |
| 6,902,433 B1 | 6/2005 | Hashimoto | |
| 2001/0010720 A1 | 8/2001 | Kimball et al. | |
| 2001/0048593 A1 * | 12/2001 | Yamauchi et al. | 361/807 |
| 2002/0056134 A1 | 5/2002 | Abe et al. | |
| 2004/0022041 A1 * | 2/2004 | Bergmann et al. | 361/784 |
| 2004/0248436 A1 | 12/2004 | Abe et al. | |
| 2005/0003685 A1 | 1/2005 | Abe et al. | |

FOREIGN PATENT DOCUMENTS

| | | |
|---|---|---|
| EP | 1 233 468 A2 | 8/2002 |
| GB | 1131171 | 10/1968 |
| GB | 1 304 092 | 1/1973 |
| JP | 3-224295 | 10/1991 |
| JP | 8-32267 | 2/1996 |
| JP | 10-75082 | 3/1998 |
| JP | 11-103427 | 4/1999 |
| JP | 2002-16524 | 1/2002 |
| JP | 2002-63920 A | 2/2002 |
| JP | 2002-198077 A | 7/2002 |
| WO | WO 98/56058 | 12/1998 |
| WO | WO 01/79012 A2 | 10/2001 |
| WO | WO 2004/031929 A1 | 4/2004 |
| WO | WO 2004/032269 A2 | 4/2004 |

* cited by examiner

CABLE MODEM DEVICE AND METHOD OF ASSEMBLING THE SAME

CROSS-REFERENCE TO RELATED APPLICATIONS

This application is a divisional of U.S. application Ser. No. 10/826,910, filed Apr. 19, 2004, now U.S. Pat. No. 7,207,106 and for which priority is claimed under 35 U.S.C. §121. Also, this application is based upon and claims the benefit of priority under 35 U.S.C. §119 from the prior Japanese Patent Application No. 2003-162021, filed Jun. 6, 2003. The entire contents of both applications are incorporated herein by reference thereto, respectively, in their entireties.

BACKGROUND OF THE INVENTION

1. Field of the Invention

The present invention relates to a cable modem device which is capable of reducing unnecessary signals inputted into a circuit substrate to process signals and a signal terminal from the outside and unnecessary radiation caused by the circuit substrate.

2. Description of the Related Art

Miniaturization or unitization (a cable modem device is incorporated into another device that is simultaneously used without being formed as a single device) has been required in a cable modem device which receives signals from the outside via an RF cable (coaxial connector) or which transmits the signals processed in an internal circuit to the outside.

When the unitized cable modem device, that is, a cable modem unit is incorporated into another device, unnecessary signals have to be sufficiently inhibited from being superposed upon received signals processed by the cable modem unit (circuit substrate) or signals generated in the circuit substrate, and unnecessary radiation from the circuit substrate has to be also inhibited from leaking to the outside.

To achieve this, the circuit substrate is housed in a shield case in order to inhibit the unnecessary signals from being superposed upon the received signals or the signals generated in the circuit substrate and to inhibit the unnecessary radiation from the circuit substrate from leaking to the outside, and this has already and broadly been performed.

In Jpn. Pat. Appln. KOKAI Publication No. 3-224295, an assembly structure of a modem housing has been proposed in which the periphery of the substrate is covered with upper/lower covers (including side surfaces), front panel, and rear panel that are molded of a resin material having elasticity.

Moreover, in Jpn. Pat. Appln. KOKAI Publication No. 2002-16524, a transmission/reception integral high-frequency device has been proposed in which a coaxial cable attaching portion is integrally disposed on the substrate and four surfaces of the substrate are covered with shield plates to enhance a communication grade.

In accordance with the examples of the constitutions described in the Jpn. Pat. Appln. KOKAI Publication Nos. 3-224295 and/or 2002-16524, even when the circuit substrate (cable modem unit) is shielded in a shield case, a configuration suitable for incorporation into another device or an arrangement or special structure of a terminal group for use in transmission/reception with respect to the other device has not been considered much.

Moreover, in a case where the circuit substrate housed in the shield case, that is, the cable modem unit is incorporated into the other device, there is a problem that assembly efficiency drops, for example, in a step of attaching an RF connector, because there is little room in space in accordance with a demand for miniaturization.

It is to be noted that, for example, in a case where the terminal group from the circuit substrate extends in a direction different from that of the RF connector, when the RF connector and circuit substrate housed in the shield case are housed into an exterior case having little room (gap), there is a problem that the terminals (in the group) are broken or deformed.

BRIEF SUMMARY OF THE INVENTION

According to an aspect of the present invention there is provided a cable modem device comprising: a first case member which shields a first circuit substrate; a second case member to house and shield a second circuit substrate on which the first case member is positioned together with the first case member; and a terminal disposed on the second case member for use in input/output of signals between the second circuit substrate and an external device.

According to an aspect of the present invention there is provided a cable modem device comprising: a first case member to shield a first circuit substrate which mainly processes analog signals; a second case member to house and shield a second circuit substrate which holds the first case member and which mainly processes mainly digital signals together with the first case member; at least one first terminal disposed on the second case member for use in input/output of signals between the second circuit substrate and an external device; at least one second terminal disposed on the first case member for use in the input/output of the signal between the first circuit substrate and the second circuit substrate; and a protruding portion which is disposed on the second case member and which is capable of fixing or grounding the second case member with respect to an external substrate.

According to an aspect of the present invention there is provided a cable modem device comprising: a circuit substrate which mainly processes analog signals; a frame member disposed along four planes crossing a plane direction of the circuit substrate at the right angles; first and second cover members disposed in the open surfaces of the frame member to provide a hexahedral shield case which shields the circuit substrate; and at least one terminal for use in input/output of signals between the circuit substrate shielded by the first and second cover members and the frame member and a second circuit substrate positioned outside the shield case to mainly process digital signals.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will hereinafter be described with reference to the drawings.

Figure 1:
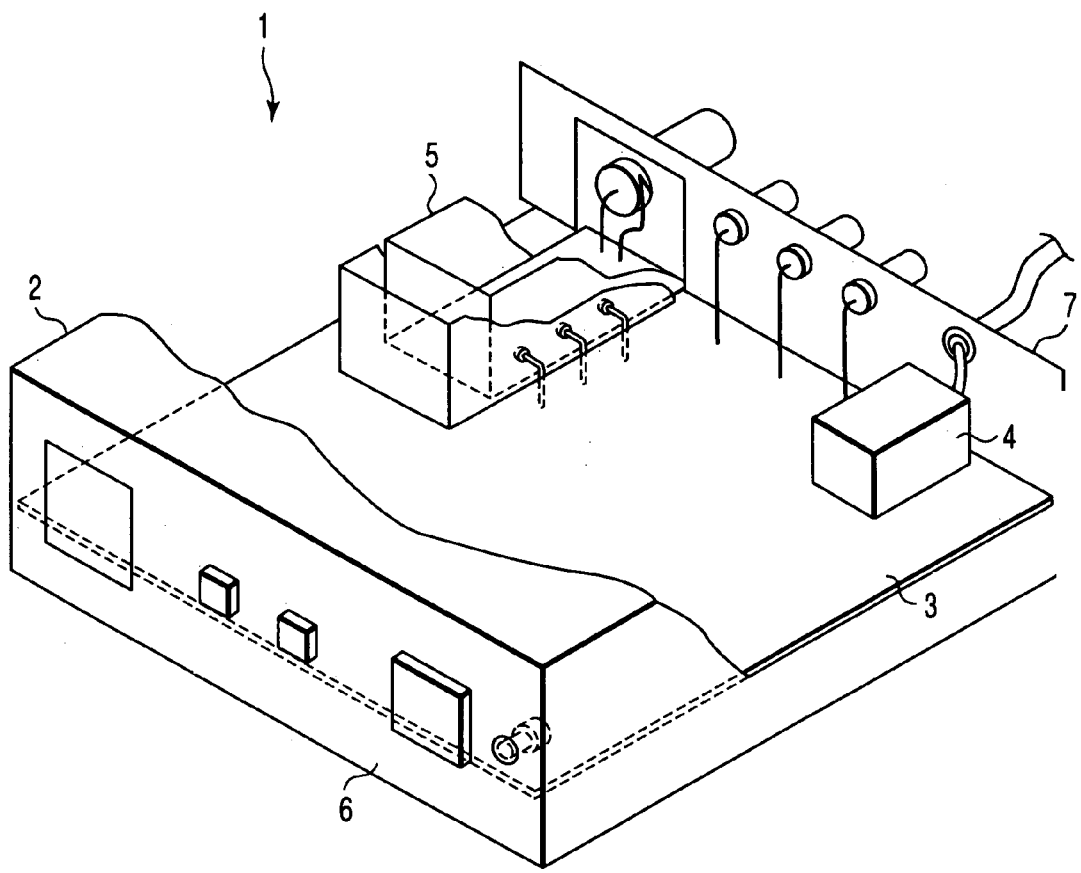
FIG. 1 is a schematic diagram showing one example of a cable modem device in which a cable modem unit of an embodiment of the present invention is incorporated or a CATV terminal device (communication terminal) on which the cable modem unit is mounted.

FIG. 1 is a block diagram showing one example of a constitution of a video recording/reproducing device to which the embodiment of the present invention is applied.

As shown in FIG. 1, for example, a cable modem device is known as a communication terminal for data communication, which is connected to a CATV network and which is capable of receiving video program or music program or character data by subscribers who have made contracts and transmitting information inputted from the subscribers to transmitters. It is to be noted that the video program or the character data is distributed to the respective terminals (subscribers) from a center station with received signals (descending signals.) at a high frequency, for example, of about 90 to 860 MHz. The information can be transmitted to the center station from each terminal with transmitted signals (ascending signals) at a high frequency, for example, of about 5 to 65 MHz.

One example of a CATV terminal device (communication terminal) 1 on which a cable modem device or a cable modem unit is mounted is shown in FIG. 1. For example, the device includes an exterior case 2, a main circuit substrate 3, a power circuit substrate 4, a cable modem unit 5, a front panel 6, a rear panel 7 and the like.

On the front panel 6, for example, there are disposed a display device which displays presence/absence of arrival of mails from a reception channel and center station, a power switch, a phono jack for sound output, a light receiving portion (window) which receives control signals from a remote terminal (remote controller) for remote operation and the like.

On the rear panel 7, for example, there are disposed a video output terminal group which outputs video signals to a CRT (television monitor) device or display device, a sound terminal group which outputs sound signals to the television monitor device, a sound amplification device (audio amplifier) and the like, an AC line capable of supplying a commercial power to the power circuit substrate 4, an RF connector disposed in a predetermined position of the cable modem unit 5 described later and the like.

Figure 2:
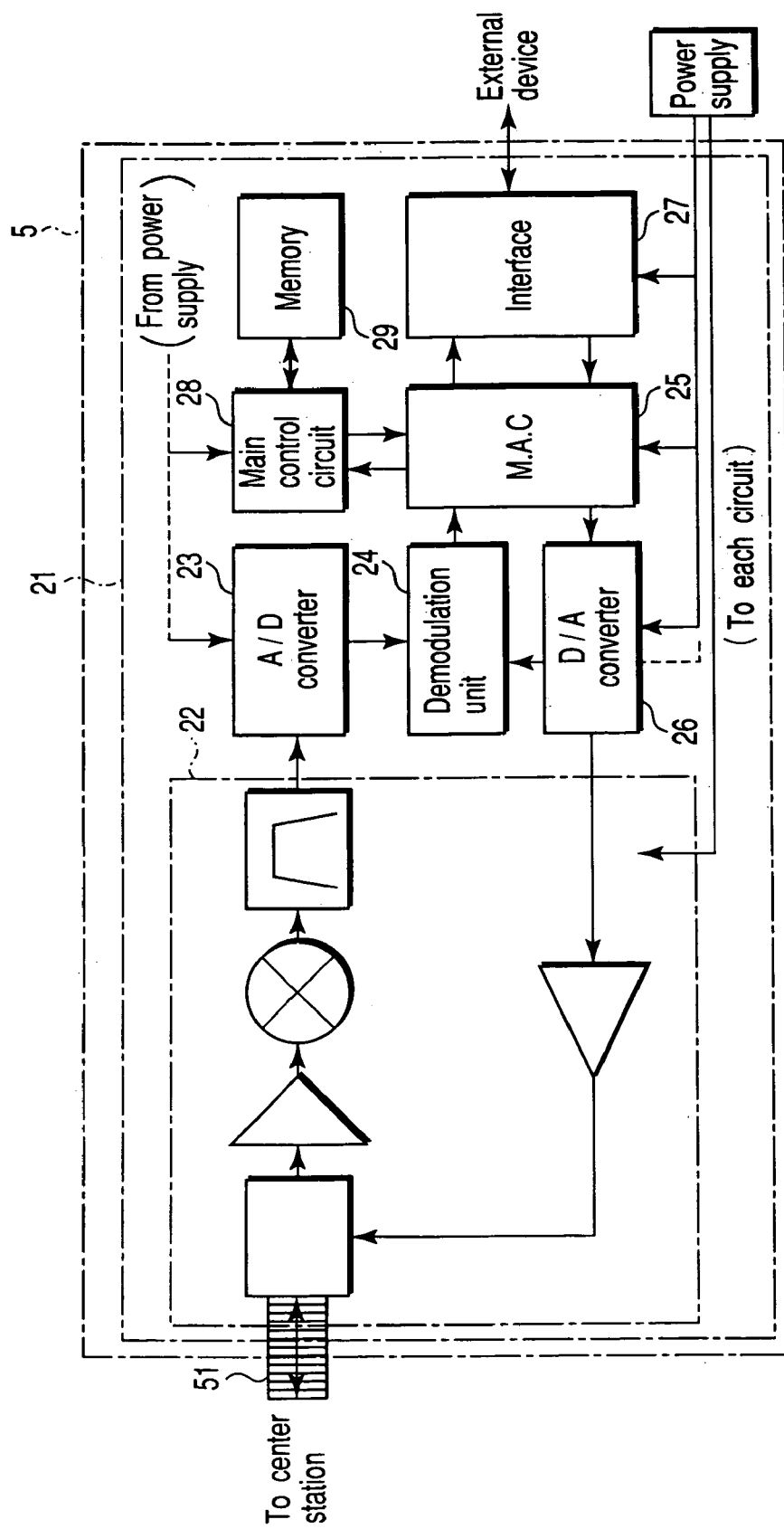
FIG. 2 is a schematic block diagram showing one example of a constitution of the cable modem unit incorporated in the communication terminal shown in FIG. 2.

As shown in a schematic block diagram of FIG. 2, the cable modem unit 5 includes an RF connector (coaxial cable) 51, a circuit substrate 21, a tuner unit 22, an A/D converter 23, a demodulation unit 24 for forming data, a media access control (MAC) unit 25, a D/A converter 26, an interface 27, a main control circuit (microcomputer) 28, a memory 29 and the like.

The RF connector (coaxial cable) 51 is connected to an RF (coaxial) cable for use, for example, in transmission/reception of signals with respect to the center station. The following various circuits and function blocks are arranged on the circuit substrate 21. The tuner unit 22 processes a high-frequency signal inputted/outputted via the RF connector 51. The A/D converter 23 converts a descending signal (analog signal) whose frequency is converted via the tuner unit 22 to a digital signal. The demodulation unit 24 demodulates the descending signal converted to the digital signal via the A/D converter 23 to form data. The MAC unit 25 generates an ascending signal (digital signal). The D/A converter 26 converts the ascending signal generated by the MAC unit 25 to the analog signal. The interface 27 conforms to Ethernet standards and the like for outputting the descending signal inputted into the MAC unit 25 to an external device. The microcomputer (main control circuit) 28 controls operations of individual circuits and function blocks.

It is to be noted that the cable modem unit 5 is disposed in the predetermined position of the main circuit substrate 3, for example, in a state in which the RF connector 51 is directed/protruded to the outside from the predetermined position of the rear panel 7.

The RF connector 51 is fixed to the predetermined position of the circuit substrate 21, for example, by soldering or caulking or contact of a contact. A power for operating the cable modem unit 5 is supplied from the power circuit substrate 4 disposed on the main circuit substrate 3.

Figure 3:
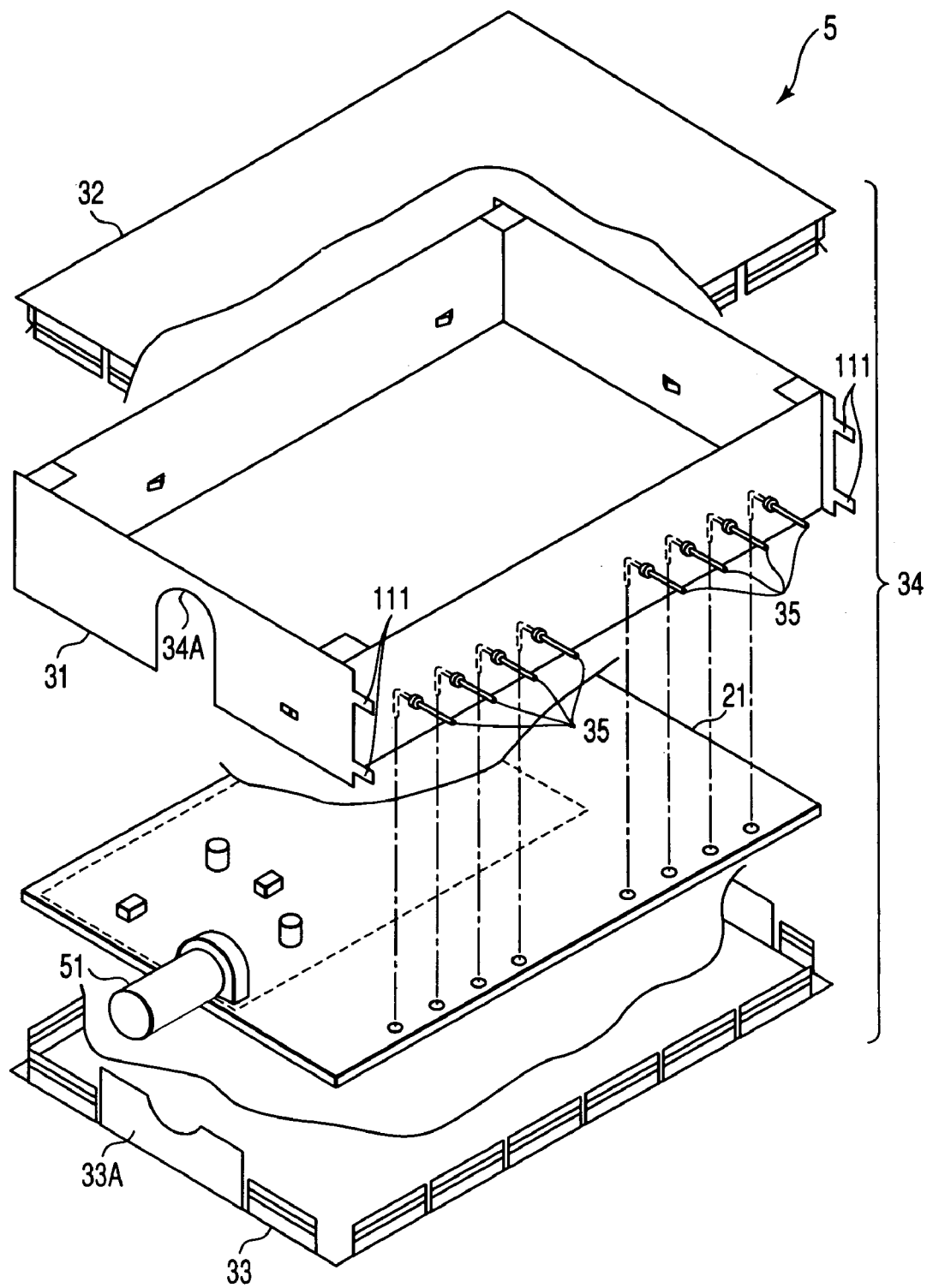
FIG. 3 is a schematic diagram showing one example of characteristic of mechanical elements of the cable modem unit disposed on a main circuit substrate of the communication terminal shown in FIG. 1.

FIG. 3 is a schematic diagram showing one example of characteristic of mechanical elements of the cable modem unit disposed on the main circuit substrate of the cable modem device shown in FIG. 1.

The cable modem unit 5 includes a metal case 31 with which four peripheral surfaces of the circuit substrate 21 are covered, a first plane portion (first cover) 32 with which one opening of the metal case 31 is covered, and a shield case (housing) 34 having a hexahedral or similar shape formed by a second plane portion (second cover) 33 with which the other opening of the metal case 31 is covered.

The metal case 31 covers four peripheral surfaces of the circuit substrate 21 on which the individual circuits and function blocks described with reference to FIG. 2 are disposed, and further shields electromagnetic waves from the outside, that is, unnecessary signals, and unnecessary radiation generated in the circuit substrate 21.

The first plane portion (first cover) 32 shields the circuit substrate 21 with respect to one opening of the metal case 31 which is a tetrahedron. The second plane portion (second cover) 33 shields the circuit substrate 21 with respect to the other opening of the metal case 31.

The circuit substrate 21 is housed in the shield case 34 which is formed of a metal or the like and which substantially covers six surfaces in this manner. Accordingly, the inside/outside of the cable modem unit 5 can be shielded from the unnecessary radiation of electromagnetic waves, and it is possible to reduce degradation of a communication function by an influence of the unnecessary radiation which is a noise from the external device or the circuit including the cable modem unit 5.

Moreover, there is an effect of reducing the unnecessary radiation which is the noise and unnecessary signal to the external device or the circuit including the cable modem device from the cable modem unit 5. Accordingly, properties of the cable modem unit 5 can be enhanced.

In the predetermined positions of the circuit substrate 21, the predetermined number of terminals 35 are arranged for use in the input/output of the signals from and to the individual circuits and blocks described with reference to FIG. 2, input/output of digital signals via the interface 27, and electric connection for supplying the power to the individual blocks. It is to be noted that the individual terminals 35 include, for example, through capacitors and the like and have a filter function with respect to incoming noises or unnecessary signals. That is, the noises and unnecessary signals entering from the individual terminals 35 can be reduced, and the properties of the cable modem unit are enhanced. The noises and unnecessary signals generated in the cable modem unit 5 can be prevented from leaking with respect to the external device or the circuit in which the cable modem unit 5 is incorporated, and the external device or the circuit can be prevented from being obstructed.

The respective terminals 35 are formed so as to be connected to the outside (arbitrary one surface of four surfaces of the metal case 31) of the housing 34 via the predetermined surface of the metal case 31 which is the tetrahedron (as seen from actual manufacturing steps, the terminals 35 fixed to the predetermined positions of the housing 34 beforehand are inserted in corresponding holes (not described in detail) disposed in the circuit substrate 21, and connected to predetermined patters of the circuit substrate 21, for example, by soldering or the like). That is, an end (leg portion) of the terminal 35 on a side opposite to a side on which the terminal 35 is fixed to the metal case 31 is directed in the same direction as an axial direction of a through hole disposed beforehand in the circuit substrate 21.

A cutout 34A capable of exposing the RF connector 51 fixed to the circuit substrate 21 to the outside of the housing 34 is formed in a predetermined surface of the housing 34, that is, the surface of the tetrahedral metal case 31 different from the surface to which the terminals 35 are fixed.

That is, the metal case 31 can be attached to the circuit substrate 21 so that the leg portion of the metal case in a direction crossing the axial direction of the RF connector 51 at right angles and on the side on which the terminals 35 are inserted in the corresponding holes of the circuit substrate 21 extends in parallel with the axial direction of the through hole of the circuit substrate 21 in a state in which the RF connector 51 is fixed to the predetermined position of the circuit substrate 21 beforehand. Since the cutout 34A opposite to the RF connector 51 is disposed in the arbitrary surface of the tetrahedral metal case 31.

Moreover, when the metal case 31 having the terminals 35 is attached to the circuit substrate 21 having the connector 51 for the coaxial cable, it is possible to insert the metal case 31 vertically to an open surface of the metal case while the open surface (the surface to which the first and second covers 32, 33 are attached) of the metal case 31 is kept horizontally without inclining the circuit substrate 21. Since the cutout 34A is disposed in the arbitrary surface of the tetrahedral metal case 31 with which the periphery of the circuit substrate 21 is covered and in a position avoiding the RF connector 51 fixed to the circuit substrate 21.

In accordance with this constitution, the terminals 35 to be inserted in the predetermined positions of the circuit substrate 21 can securely be inserted into the corresponding through holes of the circuit substrate 21. The RF connector 51 fixed to the circuit substrate 21 while the axial line of the connector is directed in a direction different from the axial direction of the terminal 35 is inhibited from inadvertently contacting the case 31. Furthermore, the optional or a plurality of or all of terminals 35 are prevented from being partially bent without being inserted in the corresponding through holes.

Thereafter, either or both of the RF connector 51 and the terminal 35 is prevented from being unfavorably damaged, and the terminals 35 are prevented from being bent. Moreover, operation properties of a step of attaching the metal case 31 to which a plurality of terminals 35 are attached beforehand to the circuit substrate 21 to which the RF connector 51 is fixed are improved, and an operation time required for the step is reduced.

This can reduce an assembly cost of the cable modem unit 5 and the cable modem device 1 including the cable modem unit 5, and results in cost reduction of final products.

Moreover, for example, leg portions or protrusions (legs or terminals) 111 capable of fixing the unit 5 to another substrate such as a host substrate (mother board) (not shown) are disposed on the cable modem unit 5 (i.e., optional portions of the shield case 34), although not described in detail. Accordingly, the unit 5 can easily be mounted (fixed) onto the host substrate. That is, the leg portions or protrusions (legs or terminals) 111 are formed integrally with the shield case 34, and the shield case 34 can easily and inexpensively be mounted on the host substrate by the soldering or using a simple connector or the like.

For example, with a structure in which the leg portions or protrusions 111 are inserted in ground pattern portions on a substrate side (not shown), the leg portions or protrusions 111 of the unit 5, that is, the shield case 34 can be fixed, for example, by the soldering or the like. When a structure for receiving the leg portions or protrusions 111 of the shield case 34 on the host substrate side is of an attachable/detachable type represented, for example, by a connector type, replacement at the time of operation confirmation or repair (change) is facilitated.

It is to be noted that the predetermined position of the second cover 33 covering a second open surface of the tetrahedral metal case 31, that is, a portion of the second cover 33 in the vicinity of the RF connector 51 fixed to the circuit substrate 21 is protruded on the side of the metal case 31 to dispose/position a protruding portion 33A in the vicinity of the RF connector 51. This reduces an opening area (cutout 34A) formed in the metal case 31 while the cutout 34A is disposed in the shield case 34. The protruding portion (shield portion) 33A covering the cutout 34A does not have to be integral with the second cover 33, and may also be formed as another piece. This reduces the input of the unnecessary radiation entering via the opening by the cutout 34A, or the output of the unnecessary radiation from the internal circuit to the outside of the cable modem unit 5. Therefore, a high-grade transmission/reception of signals is possible.

Moreover, in the housing, that is, the shield case 34 shown in FIG. 3, the tetrahedral metal case 31 has two open surfaces, but may also have one open surface by the shield case 34 integral with the first cover 32.

Figure 4:
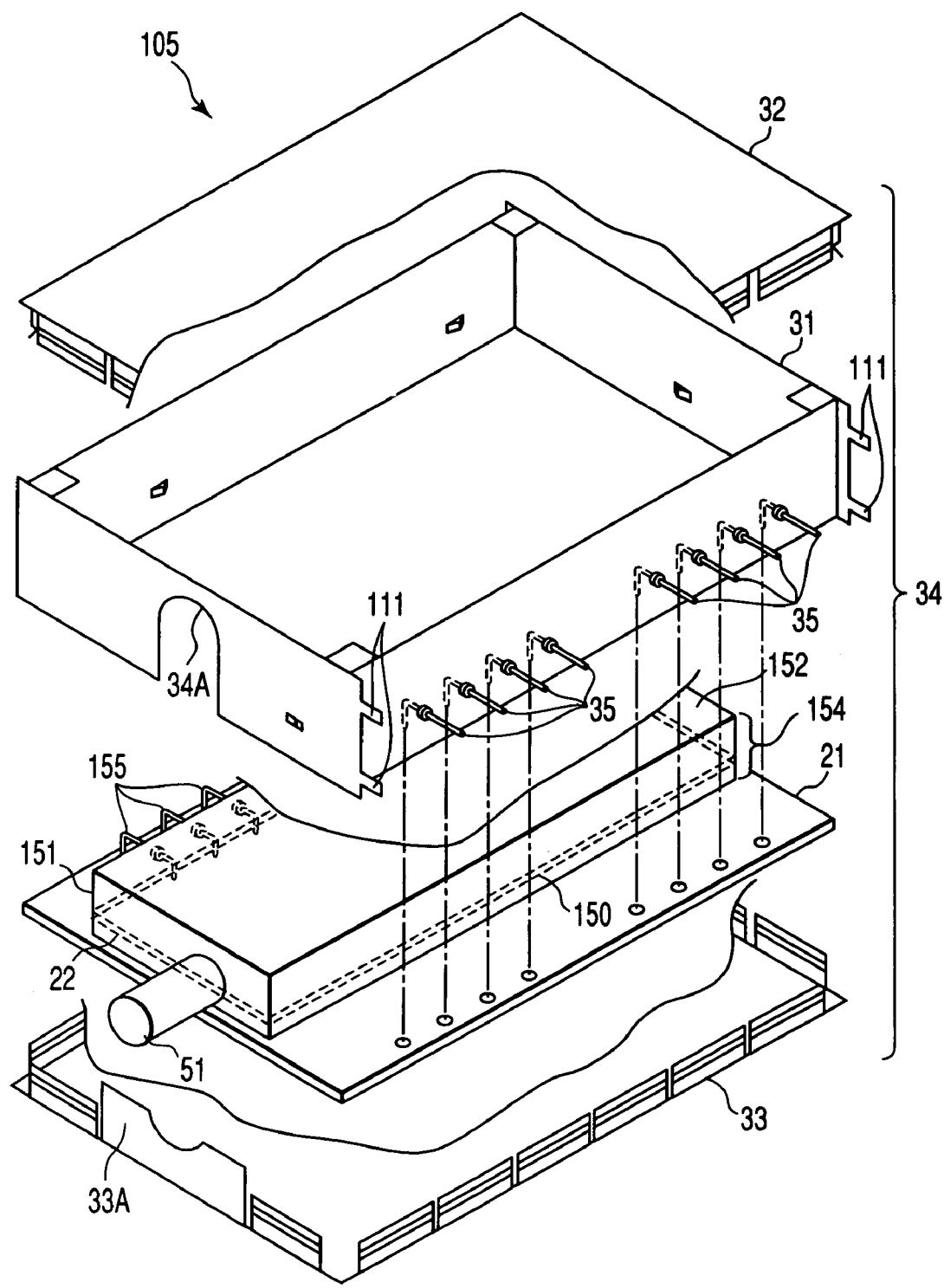
FIG. 4 is a schematic diagram showing another example of the characteristics of the mechanical elements of the cable modem unit disposed on the main circuit substrate of the communication terminal shown in FIG. 1.

FIG. 4 is a schematic diagram showing a modification of the cable modem unit shown in FIGS. 1 to 3. It is to be noted that FIG. 4 shows an example in which a tuner unit attached to the circuit substrate of the cable modem unit is housed in an independent shield case.

A cable modem unit 105 includes a tuner unit shield case 154 including a metal case 151 covering at least four peripheral surfaces of a tuner unit substrate 150 to shield the electromagnetic waves from the outside and a tuner unit cover (tuner unit plane portion) 152, and the shield case 34 covering the outside of the tuner unit shield case 154. The metal case 151 covers at least four peripheral surfaces of the tuner unit substrate 150 (schematically shown in FIG. 4) opposite to the tuner unit 22 attached to the circuit substrate 21 on which the individual circuits and function blocks described above with reference to FIG. 2 are disposed. The metal case 151 shields the electromagnetic waves from the outside. The tuner unit cover (tuner unit plane portion) 152 covers one opening of the (tetrahedral) metal case 151 while shielding the electromagnetic waves from the outside. The tuner unit cover (tuner unit plane portion) 152 is covered by a housing including at least five metal plates, that is, the tuner unit shield case 154. It is to be noted that the shield case 34 is constituted substantially in the same manner as in the shield case described above with reference to FIG. 3.

When the tuner unit substrate 150 is housed in the tuner unit shield case 154 in this manner, the noises by the unnecessary radiation into the tuner unit 22 from the microcomputer (main control circuit 28), memory 29 and the like mounted on the circuit substrate 21 can be prevented from diving in.

Moreover, since the circuit substrate 21 is housed in the shield case 34, a double shield structure is seen from the outside of the cable modem unit 105. That is, the dive of the noises by the unnecessary radiation into the tuner unit 22 of the cable modem unit 105 from the outside can further be reduced. As a result, high-grade reception is possible.

On the optional surface of the tetrahedral metal case 151 of the tuner unit shield case 154, the predetermined number of terminals 155 are arranged for use in the output of the signals from the tuner unit 22 of the circuit substrate 21, that is, the tuner unit substrate 150 and the input of the signals into the tuner unit substrate 150 (tuner unit 22). It is to be noted that the respective terminals 155 are inserted in through holes (not described in detail) formed in the predetermined positions of the circuit substrate 21, and connected to the predetermined patterns of the circuit substrate 21, for example, by the soldering or the like in a state in which the terminals are fixed to the predetermined surface of the tetrahedral metal case 151.

The respective terminals 155 include a filter function of reducing the noises and unnecessary signals of the through capacitor and the like. This reduces superposition of undesired noises and unnecessary signals upon the signals inputted/outputted via the terminals 155, and enhances transmission/reception properties of the tuner unit 22.

Moreover, the respective terminals 155 are preferably disposed on a side opposite to that of the surface on which the terminals 35 of the shield case 34 are disposed. That is, the ends (leg portions) of the terminals 155 fixed to the tuner unit shield case 154 on the side opposite to that on which the terminals are fixed to the metal case 151 are directed in the same direction as the axial direction of the through holes disposed beforehand in the circuit substrate 21.

That is, since the signals handled in the tuner unit 22 and the signals inputted/outputted via the terminals 155 are weak analog signals in many cases, communication quality is impaired by the superposition of the noises in many cases. There is also a possibility that the communication grade with respect to the center station is deteriorated by the influences of the unnecessary radiation by high-rate digital signals inputted/outputted via the terminals 35 disposed on the outer shield case 34 or the noises superposed on the signals and the unnecessary radiation.

Therefore, as described above and as shown in a concrete example of FIG. 5, the terminals 35 positioned on the outer shield case 34 and the terminals 155 positioned on the tuner unit shield case 154 are positioned on the opposite sides in a state in which the shield case 34 and tuner unit shield case 154 are seen from a direction crossing the plane along which the upper/lower covers extend at right angles (in a cut state with the optional parallel two surfaces of the tetrahedron).

In other words, the terminals 35 of the shield case 34 and the terminals 155 of the tuner unit 22 (tuner unit substrate 150) of the tuner unit shield case 154 are arranged along sides substantially facing each other on the circuit substrate 21. That is, the terminals 35 for use in the input/output of the signals on a circuit substrate 21 side and the terminal group 155 for use in the input/output of the signals on a tuner unit 22 side are arranged apart from each other on the circuit substrate 21, and accordingly the influence of the unnecessary radiation can be minimized. Therefore, the high-grade transmission/reception is possible between the tuner unit 22 and the center station.

Figure 5:
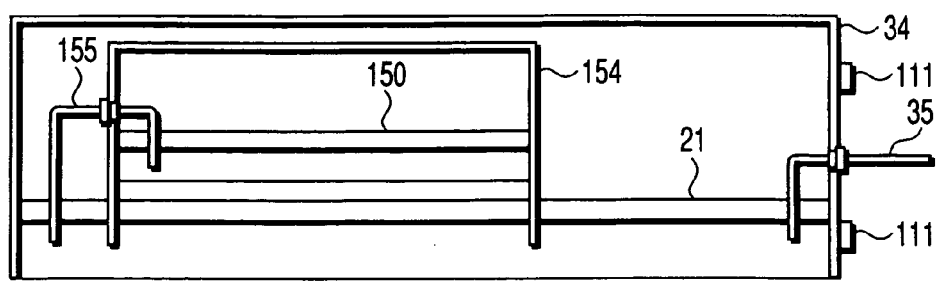
FIG. 5 is a schematic diagram showing an arrangement example of terminals for use in input/output of signals with respect to the circuit substrate housed in a shield case in the cable modem unit shown in FIG. 4.

Connecting portions (not described in detail) connectable to first terminals for use in the input/output of the signals or the terminal group 155 are linearly arranged in the cable modem unit 105 including the shield case 34 and tuner unit shield case 154 shown in FIGS. 4 and 5. Five surfaces of the circuit substrate 22 (tuner unit circuit substrate 150) for mainly processing the analog signals excluding the periphery and the substrate 22 (surface facing the substrate 22) are covered by the first shield case 154 on whose predetermined surface the first terminal or the terminal group 155 is disposed. On the other hand, connecting portions (not described in detail) connectable to a second terminal or the terminal group 35 for use in the input/output of the signals are linearly disposed in such a manner that the portions are substantially parallel to the first terminal or the terminal group 155 or at least the circuit substrate 22 is disposed between the portions and the first terminal or the terminal group 155.

In this constitution, the circuit substrate 22 (tuner unit) shielded by the shield case 154 is disposed on the circuit substrate 21 for mainly processing the digital signals, and the second shield case 34 on whose predetermined surface the second terminal or the terminal group 35 is disposed is disposed on the circuit substrate 21. Accordingly, the assembling is facilitated without requiring any special assembling step.

The cutout 34A capable of exposing the RF connector 51 fixed to the circuit substrate 21 to the outside of the shield case 34 is formed on the predetermined surface of the shield case 34, that is, the surface of the tetrahedral metal case 31 different from the surface to which the terminals 35 are fixed in the same manner as described above with reference to FIG. 3.

Therefore, in the example shown in FIG. 4, the metal case 31 of the shield case 34 can be attached to the circuit substrate 21 in a state in which the RF connector 51 protruding from the predetermined position of the tuner unit shield case 154 is fixed to the tuner unit 22 outside the tuner unit shield case 154 covering the tuner unit 22 disposed in the predetermined position of the circuit substrate 21. In the direction crossing the axial direction of the RF connector 51 at the right angles, the leg portions of the terminals 155 of the tuner unit and the terminals 35 for use in the input/output of the signals with respect to the outside of the shield case 34 on the side on which the is terminals are inserted in the corresponding holes of the circuit substrate 21 extend in parallel with the axial direction of the through holes of the circuit substrate 21.

That is, the RF connector 51 fixed to the circuit substrate 21 in such a manner that the axial line of the connector is directed in the direction different from the axial direction of the terminals 35 and 155 is inhibited from undesirably contacting the metal cases 31 and 151. Since the terminals 35 and 155 (tuner unit 22) inserted in the predetermined positions of the circuit substrate 21 can securely be inserted in the corresponding through holes of the circuit substrate 21, similarly the optional or the plurality of or all of the terminals 35 and 155 are prevented from being partially bent before inserting into the corresponding through holes disposed beforehand in the circuit substrate 21. Since the terminals 35 and 155 (tuner unit 22) can securely be inserted into the corresponding through holes of the circuit substrate 21.

Therefore, either or both of the RF connector 51 and the terminals 35 and 155 are prevented from being undesirably damaged, or the terminals 35 or 155 are prevented from being bent. The operation properties of the step of the metal cases 31 and 151 to which the plurality of terminals 35 and 155 are attached beforehand to the circuit substrate 21 to which the RF connector 51 is fixed are improved, and the operation time required for the step is reduced.

This can reduce the assembly cost of the cable modem unit 105 and the cable modem device 1 including the cable modem unit 105, and this results in the cost reduction of the final products.

For example, the predetermined position of the second cover 33 covering the second open surface of the tetrahedral metal case 31, that is, the portion of the second cover 33 in the vicinity of the RF connector 51 fixed to the circuit substrate 21 is protruded on the side of the metal case 31 to dispose/position the protruding portion (shield portion) 33A in the vicinity of the RF connector 51. This reduces the opening area (cutout 34A) formed in the metal case 31 while the cutout 34A is disposed in the housing 34. The protruding portion 33A covering the cutout 34A does not have to be integral with the second cover 33, and may also be formed as another piece.

This reduces the input of the unnecessary radiation entering via the opening by the cutout 34A, or the output of the unnecessary radiation from the internal circuit to the outside of the cable modem unit 105. Therefore, the high-grade transmission/reception of the signals is possible.

Moreover, for example, the leg portions or protrusions (legs or terminals) 111 capable of fixing the unit 105 to the other substrate such as the host substrate (mother board) (not shown) are disposed on the cable modem unit 105 (i.e., the optional portions of the shield case 34), although not described in detail. Accordingly, the unit 105 can easily be mounted (fixed) onto the host substrate. That is, the leg portions or protrusions (legs or terminals) 111 are formed integrally with the shield case 34, and the shield case 34 can easily and inexpensively be mounted on the host substrate by the soldering or using the simple connector or the like. For example, with the structure in which the leg portions or protrusions 111 are inserted in the ground pattern portions on the substrate side (not shown), the leg portions or protrusions 111 of the unit 5, that is, the shield case 34 can be fixed, for example, by the soldering or the like. When the structure for receiving the leg portions or protrusions 111 of the shield case 34 on the host substrate side is of the attachable/detachable type represented, for example, by the connector type, the replacement at the time of the operation confirmation or repair (change) is facilitated.

It is to be noted that the leg portions or protrusions 111 are useful in securing insulation or isolation between the shield case 34 and the second shield case (tuner unit shield case 154) positioned in the shield case 34. That is, since the outer shield case 34 can be grounded, the noises and unnecessary signals turning into the tuner unit circuit substrate 150 from the external substrate are reduced, and a cable modem device high in communication quality is obtained. This is realized by the leg portions or protrusions 111, even when the voltage on the ground side of the shield case 34 and the tuner unit 22 (tuner unit circuit substrate 150) positioned in the tuner unit shield case 154 is different from that on the ground side of the external substrate.

Figure 6:
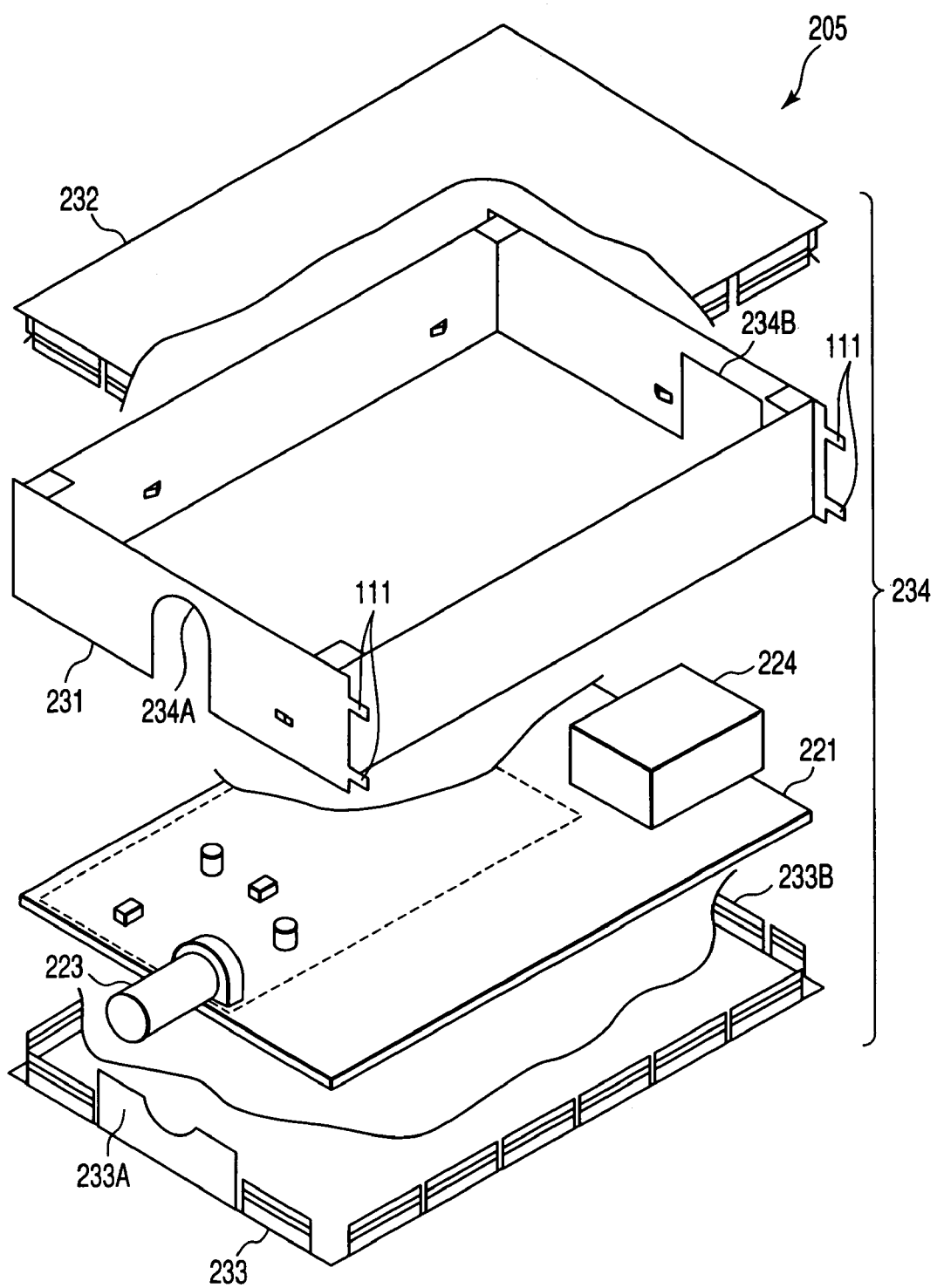
FIG. 6 is a schematic diagram showing another example of the characteristics of the mechanical elements of the cable modem unit disposed on the main circuit substrate of the communication terminal shown in FIG. 1.

On the other hand, the embodiment described with reference to FIGS. 3 to 5 is effective not only for the RF connector but also for components protruding outside the shield case. For example, as described below with reference to FIG. 6, when cutout portions 234A and 234B are disposed in a shield case 234, an effect similar to that of the example shown in FIGS. 3 and 4 is obtained. Even when components 223 and 224 disposed on different sides on a circuit substrate 221 protrude outside the shield case 234 (including a first cover 231), protruding portions 233A and 233B are disposed on a lower cover (second cover) 233 disposed in the open surface of the shield case 234 (tetrahedron). Accordingly, the opening area (cutout portions 234A and 234B) formed in the shield case 234 can be reduced in the same manner as described above. It is to be noted that the protruding portions 233A and 233B covering the cutout portions do not have to be integral with the cover 233, and may also be separate pieces.

This reduces the input of the unnecessary radiation entering via the openings by the cutout portions 234A and 234B or the output of the unnecessary radiation to the outside of a cable modem unit 205 from the internal circuit (circuit substrate 221). Therefore, the high-grade transmission/reception of the signals is possible. When the leg portions or protrusions (legs or terminals) 111 capable of fixing the shield case to the host substrate (not shown) are disposed on the predetermined positions of the shield case 34 in the same manner as described above with reference to FIGS. 3 and 4, the unit 205 can easily be mounted (fixed) onto the host substrate.

Moreover, the example of the shield case of the cable modem unit incorporated in the CATV terminal device has been described with reference to FIGS. 1 to 6, but the present invention can also be applied even when the terminal device is a game machine or the like, for example, as described below with reference to FIG. 7. For example, a game machine 501 shown in FIG. 7 includes an exterior case 502, a main circuit substrate 503, a power circuit substrate 504, a cable modem unit 505, a front panel 506, a rear panel 507 and the like. It is to be noted that the front panel 506 is connectable to a controller (input device) 511, although not described in detail.

Figure 7:
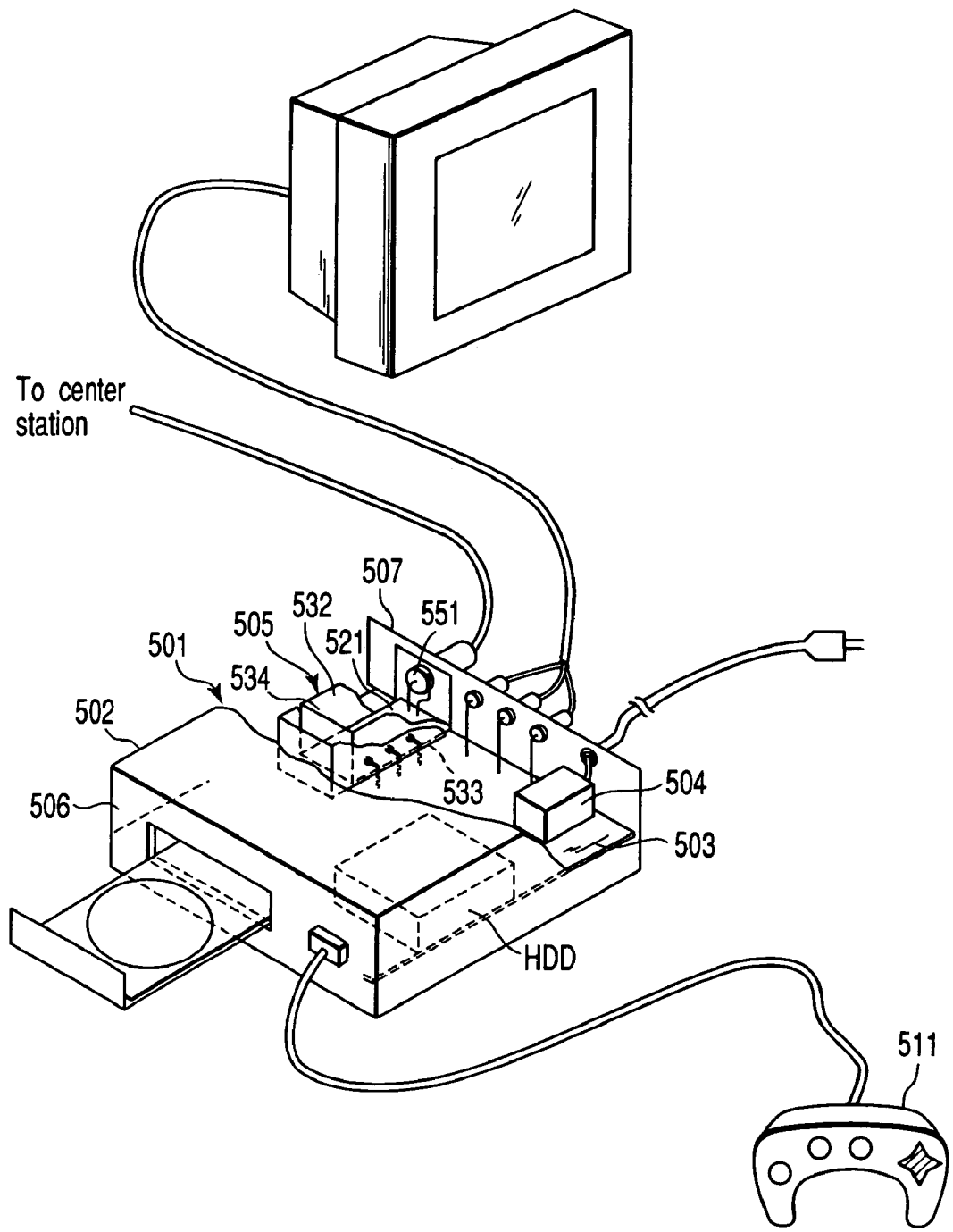
FIG. 7 is a schematic block diagram showing one example of the cable modem unit incorporated in a terminal device different from the communication terminal shown in FIG. 1.

The game machine 501 shown in FIG. 7 also includes a hard disk drive (HDD) capable of storing game software, version upgraded data, high score data and the like which can be downloaded from the center station, a communication unit capable of securing/disconnecting communication with an optional opponent who has made an entry in the center station in a war type game and the like. It is to be noted that the disk drive or a card (cartridge) slot may integrally be incorporated to prepare for a case where a main part of the game software is supplied, for example, via a disk medium of DVD standards or a storage medium (cartridge or card) of specific standards.

It is to be noted that although not described in detail, the cable modem unit 505 including, for example, an RF connector 551 attached to a circuit substrate 521 is fixed to the predetermined position of the main circuit substrate 503 in the same manner as described with reference to FIG. 3 or 4 and 5.

Moreover, since the cable modem unit 505 is shielded by a shield case 534, upper cover 532, and lower cover 533, the input of the incoming unnecessary radiation into the circuit substrate 521, or the output of the unnecessary radiation from the circuit substrate 521 to the outside of the cable modem unit 505 is reduced. Therefore, by the use of the cable modem unit (shield mechanism) of the present embodiment, the high-grade transmission/reception of the signals is possible.

As described above, in accordance with the present invention, the periphery of the circuit substrate on which the connector connectable to the coaxial cable is disposed is shielded by the shield case having a hexahedral or similar shape, and the terminals for use in the input/output of the signals with respect to the circuit substrate housed in the shield case are fixed as a noise filter type to the shield case. Accordingly, the high-grade transmission/reception of the signals is possible.

It is to be noted that the present invention is not limited to the above-described embodiments, and can variously be modified/altered without departing from the scope of an implementation stage. The embodiments may also be combined/performed as appropriately as possible, and in this case, an effect by the combination is obtained.

What is claimed is:

1. A cable modem device comprising:
   a first case member which shields a first circuit substrate configured to process at least analog signals;
   a second case member to house and shield a second circuit substrate on which the first case member is positioned together with the first case member, the second circuit substrate configured to process at least digital signals;
   an electric connection terminal disposed on and intersecting the second case member, the electric connection terminal configured to accommodate in input/output of signals between the second circuit substrate and an external device; and
   another electric connection terminal intersecting with the first case member and configured to accommodate input/output of signals between the second circuit substrate and the first circuit substrate.

2. The cable modem device according to claim 1, wherein the terminal includes a noise filter.

3. The cable modem device according to claim 1, further comprising:
   a protruding portion which is disposed on the second case member and which is capable of fixing or grounding the second case member with respect to an external substrate.

4. The cable modem device according to claim 1, wherein the first case member includes a connecting portion for connecting to the second circuit substrate in which the connecting portion is embedded to the second circuit substrate.

5. The cable modem device according to claim 3, wherein the electric connection terminal and the other electric connection terminal are disposed along two sides which cross a plane direction of the second circuit substrate at the right angles and which face each other.

6. The cable modem device according to claim 3, wherein the first case member includes a tetrahedron which is capable of shielding four planes crossing the plane direction of the first circuit substrate at the right angles and at least one open surface defined by the tetrahedron, and the first terminal is disposed on an optional surface of the tetrahedron.

7. The cable modem device according to claim 3, wherein the second case member includes a tetrahedron which is capable of shielding four planes crossing the plane direction of the second circuit substrate at the right angles and at least one open surface defined by the tetrahedron, and the other electric connection terminal is disposed on an optional surface of the tetrahedron.

8. The cable modem device according to claim 6, wherein the surface of the second case member on which the other electric connection terminal is disposed faces the surface of the first case member on which the electric connection terminal is disposed in a state in which the first circuit substrate is positioned between both the surfaces.

9. The cable modem device according to claim 7, wherein the surface of the second case member on which the other electric connection terminal is disposed faces the surface of the first case member on which the electric connection terminal is disposed in a state in which the first circuit substrate is positioned between both the surfaces.

* * * * *